United States Patent [19]

Anthony et al.

[11] 4,184,897

[45] Jan. 22, 1980

[54] DROPLET MIGRATION DOPING USING CARRIER DROPLETS

[75] Inventors: Thomas R. Anthony; Harvey E. Cline, both of Schenectady, N.Y.

[73] Assignee: General Electric Company, Schenectady, N.Y.

[21] Appl. No.: 944,280

[22] Filed: Sep. 21, 1978

[51] Int. Cl.² .......................................... H01L 21/225
[52] U.S. Cl. ................................... 148/1.5; 148/178; 148/188
[58] Field of Search ................ 148/1.5, 188, 178, 171

[56] References Cited

U.S. PATENT DOCUMENTS

| | | | |
|---|---|---|---|
| 2,813,048 | 11/1957 | Pfann | 148/1 |
| 3,988,762 | 10/1976 | Cline et al. | 357/48 |
| 3,988,766 | 10/1976 | Anthony et al. | 357/60 |
| 3,988,767 | 10/1976 | Anthony et al. | 357/60 |
| 3,988,768 | 10/1976 | Anthony et al. | 357/60 |
| 3,998,662 | 12/1976 | Anthony et al. | 148/1.5 |
| 4,001,047 | 1/1977 | Boah | 148/171 X |
| 4,010,534 | 3/1977 | Anthony et al. | 29/572 |
| 4,032,364 | 6/1977 | Anthony et al. | 148/187 X |

*Primary Examiner*—G. Ozaki
*Attorney, Agent, or Firm*—Donald M. Winegar; Joseph T. Cohen; Leo I. MaLossi

[57] ABSTRACT

Carrier droplets are employed in moving melts of metal-rich semiconductor material through a solid body of semiconductor material by thermal gradient zone melting. One element of the droplet is selected for its ability to penetrate and migrate through the semiconductor material at a reasonable rate. One or more second elements are included in the droplet to impart the desired level of resistivity, conductivity type and/or level of lifetime to the recrystallized semiconductor material or to the material of the body.

10 Claims, No Drawings a new and improved method to migrate molten lines and droplets of metal through a solid body of semiconductor material by thermal gradient zone melting (TZGM) processing which overcomes the deficiencies of the prior art.

DROPLET MIGRATION DOPING USING CARRIER DROPLETS

BACKGROUND OF THE INVENTION

1. Field of the Invention

This invention relates to a method of migrating a melt of a metal through a solid body of semiconductor material by thermal gradient zone melting (TGZM) and, in particular, to the uniform initiation of promotion of reasonable rates of thermal migration by utilizing an element to enhance the penetration of a melt into the material at the surface and to function as a carrier droplet for a dopant or a life-time adjusting material which has either a high vapor pressure and/or a slow rate of migration.

2. Description of the Prior Art

W. G. Pfann in U.S. Pat. Nos. 2,739,088 and 2,813,048 describes methods of migrating melts of metal through particular regions of a solid body of semiconductor material by thermal gradient zone melting. However, molten line and droplet stability resulted in the breakup of the migrating lines and droplets and consequently acceptable semiconductor devices were not always obtainable.

Recently, we discovered that preferred planar orientation of the surfaces of the body of semiconductor material, migration axis and line orientation axis relationship were also a necessity to migrate liquid metal wires and/or droplets through the solid body. (See U.S. Pat. Nos. 3,899,362 and 3,904,442 for example.) These improvements in TGZM resulted in commercialization of the process. However, as the width of the lines being migrated became smaller, the penetration of fine liquid lines of less than 2 mils in width, and preferably 1 mil in width, and small liquid droplets, less than 6 mils in diameter, from the surface of a wafer or body of semiconductor material has been difficult to achieve repeatedly, on a commercial basis, by a thermal gradient alone. Although a thermal gradient is strong enough to cause migration of the small liquid zones once they are formed in the bulk of semiconductor material, the thermal gradient force is not powerful enough to overcome the surface tension forces holding fine liquid zones, or wires, on the surface of a body, or wafer. Further improvements to the TGZM processing techniques included alloying the deposited metal to the surface (U.S. Pat. No. 3,897,277) and sintering of the same (U.S. Pat. No. 4,006,040). The problem still persists as one attempts to migrate fine lines and droplets on a commercial basis. As a result, TGZM to date has been limited to line and droplet dimensions typical of solid-state power devices and has not had any commercial impact on integrated-circuit type devices which require a much finer size of doped region.

Although aluminum has been the predominant metal migrated by TGZM one needs other configurations than P+N type diodes and the like. However, some other elements used in doping semiconductor materials either have too high a vapor pressure or too slow a rate of migration when employed in TGZM processing.

Improvements in processing semiconductor material can be obtained if the melt penetration into the material prior to thermal migration could be enhanced by including a material therein, along with the one or more dopant impurity materials, which would prevent premature vaporization and/or improve the rate of thermal migration through the semiconductor material.

Therefore, it is an object of this invention to provide a new and improved method to migrate molten lines and droplets of metal through a solid body of semiconductor material by thermal gradient zone melting (TZGM) processing which overcomes the deficiencies of the prior art.

Another object of this invention is to provide a new and improved method for initiating the penetration of a melt to be migrated thermally regardless of whether it is for fine molten lines and droplets or larger.

A further object of this invention is to provide a material in the melt to be migrated thermally through the semiconductor material which will enable one to achieve reasonable rates of thermal migration and/or uniform penetration of the melt into the material prior to initiation of migration.

Other objects of this invention will, in part, be obvious, and will, in part, appear hereinafter.

BRIEF DESCRIPTION OF THE INVENTION

In accordance with the teachings of this invention there is provided an improvement in the method of moving a melt of a metal-rich semiconductor material through a solid body of semiconductor material. The improvement consists of including in the layer of metal which forms the melt to be migrated through the body at least one metal or element to enhance the penetration of the melt into the body and to do so more uniformly as well as to increase the migration rate of the melt through the body. At least one second metal is included to impart desirable electrical characteristics to the recrystallized region formed in situ by TGZM processing such as levels of resistivity, type of conductivity and/or control of lifetime of the material.

When the semiconductor material is silicon, the suitable first metals are silver, gold, platinum, tin, aluminum, gallium, indium and magnesium. Suitable second metals are phosphorus, arsenic, antimony, boron, aluminum, gallium, indium, silver, gold and platinum when the semiconductor material is silicon.

The choice of metals is not indiscriminate but depends on electrical characteristics required and temperature of migration in order to avoid the formation of intermetallics.

For germanium, suitable second metals are aluminum, gallium and arsenic and suitable first metals are lead, silver, cadmium, thallium, zinc, tin, gold and indium.

In order to help melt initiation, the layer of metal may also include a third material which may be a predetermined amount of the semiconductor material comprising the body.

DESCRIPTION OF THE INVENTION

A body of semiconductor material is selected for a particular level of resistivity and a first type conductivity. The body has opposed major surfaces which are the top and bottom surfaces, respectively, thereof. The semiconductor material comprising the body may be silicon, silicon carbide, germanium, gallium arsenide, a compound of a Group II element and a Group VI element, and a compound of a Group III and a Group V element.

The thermal migration of metal wires is preferably practiced in accordance with the planar orientations, thermal migration directions, stable wire directions and stable wire sizes of Table I.

TABLE I

| Wafer Plane | Migration Direction | Stable Wire Directions | Stable Wire Sizes |
|---|---|---|---|
| (100) | <100> | <011>* | <100 microns |
|  |  | <0$\bar{1}$1>* | <100 microns |
| (100) | <110> | <1$\bar{1}$0>* | <150 microns |
| (111) | <111> | (a) <01$\bar{1}$> |  |
|  |  | <10$\bar{1}$> | <500 microns |
|  |  | <1$\bar{1}$0> |  |
|  |  | (b) <11$\bar{2}$>* |  |
|  |  | <$\bar{2}$11>* | <500 microns |
|  |  | <1$\bar{2}$1>* |  |
|  |  | (c) Any other* direction in (111) plane. | <500 microns |

*The stability of migrating wire is sensitive to the alignment of the thermal gradient with the <100>, <110> and <111> axis, respectively.
*Group a is more stable than group b which is more stable than group c.

Droplets are migrated in the migration direction. The shape of the droplet is determined by the wafer plane orientation and migration direction. In a crystal axis direction of <111> of thermal migration, the droplet migrates in a triangular platelet laying in a (111) plane. A droplet migrates in the <100> crystal axis direction as a regular pyramid bounded by four forward (111) planes and a rear (100) plane. Alternately, the droplet may have a triangular shape.

A droplet migrates in the <110> crystal axis direction as an irregular pyramid with a diamond base.

The temperature gradient zone melting process and apparatus is not a part of this invention. For a more thorough understanding of the temperature gradient zone melting process employed in this invention and for a more thorough description of the apparatus employed for this process, one is directed to the following U.S. patents entitled Method of Making Deep Diodes, U.S. Pat. No. 3,901,736; Deep Diode Device and Method, U.S. Pat. No. 3,902,925; Deep Diode Devices and Method and Apparatus, U.S. Pat. No. 4,091,257, High Velocity Thermomigration Method of Making Deep Diodes; U.S. Pat. No. 3,898,106; Deep Diode Device and Method, U.S. Pat. No. 3,902,925; The Stabilized Droplet Method of Making Deep Diodes Having Uniform Electrical Properties, U.S. Pat. No. 3,899,361; Method of Making Isolation Grids in Bodies of Semiconductor Material, U.S. Pat. No. 3,979,230; and Thermomigration of Metal-Rich Liquid Wires Through Semiconductor Materials, U.S. Pat. No. 3,899,962.

The surface of the body of semiconductor material is prepared by usual semiconductor processing techniques for deposition of the metal to be migrated through the solid body of material. The metal may be deposited by any suitable means on the surface of initiation of melt migration. For example, when the body is of N-Type silicon semiconductor material and the melt to be migrated comprises, at least in part, aluminum, it has been discovered that the vapor deposition of the layer of aluminum metal should be performed at a pressure of approximately $1 \times 10^{-5}$ torr but not greater than $5 \times 10^{-5}$ torr. When the pressure is greater than $5 \times 10^{-5}$ torr, we have found that in the case of aluminum metal vapor deposited, the aluminum does not easily penetrate into the silicon and migrate through the body. It is believed that the layer of aluminum is saturated with oxygen and prevents reduction by the aluminum metal of the very thin silicon oxide layer between the deposited aluminum and the silicon. Thus, the initial melt of aluminum and silicon required for migration is not obtained because of the inability of the aluminum layer to wet and alloy with the underlaying silicon. In a similar manner, the aluminum deposited by sputtering is not as desirable as sputtered aluminum appears to be saturated with oxygen from the sputtering process, thereby preventing the reduction of any intervening silicon oxide. The preferred methods of depositing aluminum on the silicon body are by the electron beam method and the like wherein little, if any, oxygen can be trapped in the aluminum.

However, all diodes cannot be of the P+N type because many semiconductor applications require not only P+ doping but P, N and N+ doping. It has been discovered that aluminum along with silver, gold, platinum, tin, gallium, indium and magnesium are suitable for use as a carrier droplet. A carrier droplet is, in essence, a material which carries and spreads suitable levels of one or more dopant materials in the semiconductor through which it migrates by thermal gradient zone melting.

The carrier droplet concept essentially divides droplet, or wire line, migration doping into two separate functions. The first function is to provide a metal for the carrier droplet which is selected solely for its ability to penetrate into and migrate through the semiconductor material at reasonable rates. The second function is to provide one or more metals dissolved in the carrier droplet, or wire line, to provide the required level of resistivity, type of conductivity and/or the magnitude of lifetime that is produced in the recrystallized semiconductor material formed by the thermal migration of the carrier droplet through the body.

The metals to be selected for the function of the carrier droplet are selected in accordance with the semiconductor material to be processed. For example, in the instance of silicon semiconductor material, the metals selected must be compatible with the following restriction requirements:

1. N type dopant impurity metals for silicon semiconductor material are P, As and Sb.

2. P type dopant impurity metals for silicon semiconductor material are B, Al, Ga, and In.

3. To decrease lifetime in silicon semiconductor material, gold platinum and silver either by themselves or in conjunction with the carrier metals listed in Table II are employed.

4. The carrier material must not have a vapor pressure higher than about $10^{-2}$ torr (mmHg) at the temperature at which the droplet first penetrates into the silicon from the surface or else the droplet will evaporate before it can penetrate into the silicon and seal itself off to the atmosphere.

5. The dopant impurity material added to the carrier material must not have a vapor pressure such that it will evaporate from the droplet during the penetration process such that the droplet is left without the desired level of dopant impurity material.

6. The carrier material and/or the dopant impurity material must not form an intermetallic compound with silicon at the migration temperature, thereby preventing droplet migration.

7. The solubility of silicon in the carrier material at the migration temperature must be large enough to produce reasonable droplet migration rates.

8. The change of the solubility of silicon in the carrier droplet material with temperature must be large enough to produce reasonable droplet migration rates.

9. The carrier material must be capable of being vapor deposited in a form (e.g. not saturated with oxygen) so that it is compatible with the photolithographic-etching process required to produce the initial array of lines or droplets.

10. The carrier-dopant liquid must wet silicon in the case of the migration of lines so that the lines do not ball up and break up upon melting.

In Table II the carrier droplet materials for silicon semiconductor material are listed along with the various dopant impurity materials and materials which affect the lifetime of the semiconductor material.

TABLE II

| Dopant Impurity Material | Carrier Droplet Material | Ag | Au | Pt | Sn | Al | Ga | In | Mg |
|---|---|---|---|---|---|---|---|---|---|
| N-type | P | N→N+ | N→N+ | N→N+ | N→N+ | Not Practical | P+→N+ | P+→N N+>1060° C. | Not Practical |
|  | As | N→N+ | N→N+ | N→N+ | N→N+ | P→N+ >1200° C. | P→N >1238° C. | P→N+ >940° C. | Not Practical |
|  | Sb | N→N+ | N→N+ | N→N+ >1226° C. $\tau(T)$ | N→N+ | P→N+ >1065° C. | P→N+ | P→N+ >550° C. | N→N+ >1228° C. |
| P-Type | B | Not Practical | Not Practical | P→N+ $\tau(T)$ | Not Practical | P++ | Not Practical | Not Practical | Not Practical |
|  | Al | P→P+ | P→P+ >1060° C. | P→P+ $\tau(T)$ >1226° C. | P→P+ | P+ | P+ | P+ | P→P+ |
|  | Ga | P→P+ | P→P+ >500° C. | Not Practical | P→P+ | P+ | P+ | P+ | P→P+ >1228° C. |
|  | In | P→P+ | P→P+ >550° C. | Not Practical | P→P+ | P+ |  | P+ | P→P+ |
| lifetime killers | Ag | $\tau(c)$ $\tau(T)$ | $\tau(c)$ $\tau(T)$ | $\tau(c)$ $\tau(T)$ >1226° C. |  | P+ $\tau(c)$ | P+ $\tau(c)$ | P $\tau(c)$ | $\tau(c)$ >1228° C. |
|  | Au | $\tau(c)$ $\tau(T)$ | $\tau(c)$ $\tau(T)$ | $\tau(c)$ $\tau(T)$ >1226° C. | $\tau(c)$ | P+ $\tau(c)$ >1060° C. | P+ $\tau(c)$ | P $\tau(c)$ | >1150° C. $\tau(c)$ |
|  | Pt | $\tau(c)$ $\tau(T)$ | $\tau(c)$ $\tau(T)$ | $\tau(c)$ $\tau(T)$ >1226° C. | $\tau(c)$ | P+ $\tau(c)$ >1180° C. | P+ $\tau(c)$ | P $\tau(c)$ | Not Practical |
|  | None | $\tau(T)$ | $\tau(T)$ | $\tau(T)$ >1226° C. |  | P+ | P+ | P | $\tau(T)$ |

$\tau(c)$ = Variable lifetime with dopant concentration
$\tau(T)$ = Variable lifetime with Temperature It is necessary to know the vapor pressures for each of the materials in a carrier droplet at the minimum migration temperatures in order to select the materials to be used in combination in a carrier droplet. Usually the minimum migration temperature is the eutectic temperature provided no intermetallics are formed with silicon. This information is provided in Tables III through IX along with the change of silicon solubility with temperature in the carrier $\delta c/\delta Y$, the difference in concentration of silicon in pure silicon and in the liquid carrier droplet $C_S - C_L$ and the carrier droplet velocity with respect to the temperature gradient, V/G, for the various carrier materials.

TABLE III

Silver Carrier
Minimum Migration Temperature: 830° C.

| °C. | Vapor Pressure (torr) | $\frac{\delta C}{\delta T}$ (atom fraction/°K.) | $C_S-C_L$ (atom fraction) | Solubility (atoms/cm$^3$) | V/G (cm$^2$/sec-K.°) |
|---|---|---|---|---|---|
| 1000 | $7 \times 10^{-3}$ | $6 \times 10^{-4}$ | 0.8 | $6 \times 10^{15}$ | $7.5 \times 10^{-8}$ |
| 1100 | $4 \times 10^{-2}$ | $9 \times 10^{-4}$ | 0.73 | $10^{16}$ | $1.2 \times 10^{-7}$ |
| 1200 | $2 \times 10^{-1}$ | $1.7 \times 10^{-4}$ | 0.62 | $8 \times 10^{16}$ | $2.7 \times 10^{-7}$ |
| 1300 | 1 | $5.0 \times 10^{-4}$ | 0.38 | $5 \times 10^{16}$ | $1.3 \times 10^{-6}$ |
| 1400 | >1 | $2.5 \times 10$ | 0.03 | $2 \times 10^{16}$ | $8.3 \times 10^{-6}$ |

TABLE IV

Gold Carrier
Minimum Migration Temperature: 370° C.

| °C. | Vapor Pressure (torr) | $\frac{\partial C}{\partial T}$ (atom fraction/°K.) | $C_S-C_L$ (atom fraction) | Solubility (atoms/cm$^3$) | V/G (cm$^2$/sec-K.°) |
|---|---|---|---|---|---|
| 400 | $<10^{-11}$ | $2.6 \times 10^{-4}$ | .68 | $10^{13}$ | $3.8 \times 10^{-4}$ |
| 600 | $10^{-11}$ | $3 \times 10^{-4}$ | .63 | $10^{14}$ | $4.8 \times 10^{-4}$ |
| 800 | $10^{-9}$ | $3.8 \times 10^{-4}$ | .56 | $10^{15}$ | $6.8 \times 10^{-4}$ |
| 1000 | $10^{-6}$ | $5.5 \times 10^{-4}$ | .47 | $10^{16}$ | $1.17 \times 10^{-3}$ |
| 1200 | $10^{-4}$ | $1.1 \times 10^{-3}$ | .30 | $8 \times 10^{16}$ | $3.6 \times 10^{-3}$ |

TABLE IV-continued
Gold Carrier
Minimum Migration Temperature: 370° C.

| °C. | Vapor Pressure (torr) | $\frac{\partial C}{\partial T}$ (atom fraction/°K.) | $C_S$-$C_L$ (atom fraction) | Solubility (atoms/cm$^3$) | V/G (cm$^2$/sec-K.°) |
|---|---|---|---|---|---|
| 1400 | $10^{-3}$ | $2 \times 10^{-3}$ | .01 | $2 \times 10^{16}$ | $2 \times 10^{-3}$ |

TABLE V
Indium Carrier
Minimum Migration Temperature: 800° C.

| (°C.) | Vapor Pressure (torr) | $\frac{\partial C}{\partial T}$ (atom fraction/°K.) | $C_S$-$C_L$ (atom fraction) | Solubility (atoms/cm$^3$) | V/G (cm$^2$/sec-K.°) |
|---|---|---|---|---|---|
| 1000 | $4 \times 10^{-2}$ | $2.5 \times 10^{-4}$ | 0.93 | | $2.7 \times 10^{-8}$ |
| 1200 | $5 \times 10^{-1}$ | $7 \times 10^{-4}$ | 0.88 | | $8 \times 10^{-8}$ |
| 1300 | 2atm | $10^{-2}$ | 0.5 | | $2 \times 10^{-6}$ |

TABLE VI
Platinum Carrier
Minimum Migration Temperature: 1229° C.

| (°C.) | Vapor Pressure | $\frac{\partial C}{\partial T}$ (atom fraction/°K.) | $C_S$-$C_L$ (atom fraction) | Solubility (atoms/cm$^3$) | V/G (cm$^2$/sec-K.°) |
|---|---|---|---|---|---|
| 1250 | $10^{-8}$ | $7.5 \times 10^{-4}$ | 0.2 | | $3.8 \times 10^{-7}$ |
| 1300 | $2 \times 10^{-8}$ | $1 \times 10^{-3}$ | 0.15 | | $8.7 \times 10^{-7}$ |
| 1400 | $2 \times 10^{-7}$ | $1.6 \times 10^{-3}$ | 0.03 | | $5.3 \times 10^{-6}$ |

TABLE VII
Tin Carrier
Minimum Migration Temperature: 400° C.

| °C. | Vapor Pressure (torr) | $\frac{\partial C}{\partial T}$ (atom fraction/°K.) | $C_S$-$C_L$ (atom fraction) | Solubility (atoms/cm$^3$) | V/G (cm$^2$/sec-K.°) |
|---|---|---|---|---|---|
| 1000 | $10^{-4}$ | $3.3 \times 10^{-4}$ | 0.95 | $5 \times 10^{19}$ | $3.4 \times 10^{-8}$ |
| 1100 | $10^{-3}$ | $4 \times 10^{-4}$ | 0.9 | $5 \times 10^{19}$ | $4.5 \times 10^{-8}$ |
| 1200 | $5 \times 10^{-3}$ | $1.5 \times 10^{-3}$ | 0.82 | $5 \times 10^{19}$ | $1.8 \times 10^{-7}$ |
| 1300 | $2 \times 10^{-2}$ | $4 \times 10^{-3}$ | 0.5 | $5 \times 10^{19}$ | $8 \times 10^{-7}$ |
| 1400 | $8 \times 10^{-2}$ | $4 \times 10^{-3}$ | 0.05 | $5 \times 10^{19}$ | $8 \times 10^{-6}$ |

TABLE VIII
Aluminum Carrier
Minimum Migration Temperature: 577° C.

| °C. | Vapor Pressure (torr) | $\frac{\partial C}{\partial T}$ (atom fraction/°K.) | $C_S$-$C_L$ (atom fraction) | Solubility (atoms/cm$^3$) | V/G (cm$^2$/sec-K.°) |
|---|---|---|---|---|---|
| 600 | $10^{-10}$ | $7 \times 10^{-4}$ | 0.88 | $7 \times 10^{18}$ | $7 \times 10^{-4}$ |
| 700 | $10^{-9}$ | $7 \times 10^{-4}$ | 0.89 | $9 \times 10^{18}$ | $8 \times 10^{-4}$ |
| 800 | $10^{-7}$ | $8 \times 10^{-4}$ | 0.73 | $1 \times 10^{19}$ | $1 \times 10^{-3}$ |
| 900 | $10^{-5}$ | $9 \times 10^{-4}$ | 0.65 | $1.3 \times 10^{19}$ | $1.4 \times 10^{-3}$ |
| 1000 | $6 \times 10^{-5}$ | $1 \times 10^{-3}$ | 0.56 | $2 \times 10^{19}$ | $2 \times 10^{-3}$ |
| 1100 | $3 \times 10^{-4}$ | $1.1 \times 10^{-3}$ | 0.47 | $2 \times 10^{19}$ | $4 \times 10^{-3}$ |
| 1200 | $10^{-2}$ | $1.25 \times 10^{-3}$ | 0.35 | $2 \times 10^{19}$ | $6 \times 10^{-3}$ |
| 1300 | $4 \times 10^{-2}$ | $1.6 \times 10^{-3}$ | 0.22 | $1.5 \times 10^{19}$ | $1.5 \times 10^{-2}$ |
| 1400 | $10^{-1}$ | $1.6 \times 10^{-3}$ | 0.06 | $4 \times 10^{18}$ | $3 \times 10^{-2}$ |

TABLE IX
Gallium Carrier
Minimum Migration Temperature: 600° C.

| °C. | Vapor Pressure (torr) | $\frac{\partial C}{\partial T}$ (atom fraction/°K.) | $C_S$-$C_L$ (atom fraction) | Solubility (atoms/cm$^3$) | V/G (cm$^2$/sec-K.°) |
|---|---|---|---|---|---|
| 800 | $5 \times 10^{-5}$ | $2.8 \times 10^{-4}$ | 0.9 | $10^{19}$ | $3.1 \times 10^{-8}$ |
| 1000 | $5 \times 10^{-3}$ | $1.1 \times 10^{-3}$ | 0.8 | $2 \times 10^{19}$ | $1.4 \times 10^{-8}$ |
| 1200 | $5 \times 10^{-1}$ | $2 \times 10^{-3}$ | 0.5 | $4 \times 10^{19}$ | $4 \times 10^{-7}$ |
| 1400 | 2 | $3 \times 10^{-3}$ | 0.01 | $10^{19}$ | $3 \times 10^{-5}$ |

The equilibrium vapor pressure $P_o$ of a pure dopant impurity material is given in Table X with respect to various migration temperatures.

TABLE X

| Dopants Temp. | Equilibrium Vapor Pressure $P_o$ of Pure Dopant Elements (torr) | | | | | | |
|---|---|---|---|---|---|---|---|
| | P | As | Sb | B | Al | Ga | In |
| 400 | $10^3$ | $2\times10^1$ | $7\times10^{-4}$ | ↑ | | $10^{-11}$ | $10^{-1}$ |
| 500 | too high | $6\times10^1$ | $6\times10^{-3}$ | ↑ | $10^{-12}$ | $2\times10^{-9}$ | $2\times10^{-9}$ |
| 600 | ↓ | $2\times10^2$ | $6\times10^{-2}$ | ↑ | $10^{-10}$ | $10^{-7}$ | $2\times10^{-7}$ |
| 700 | ↓ | too high | $6\times10^{-1}$ | ↑ | $10^{-8}$ | $3\times10^{-6}$ | $3\times10^{-6}$ |
| 800 | ↓ | ↓ | 2 | ↑ | $3\times10^{-7}$ | $10^{-4}$ | $3\times10^{-5}$ |
| 900 | ↓ | ↓ | 6 | ↑ | $10^{-5}$ | $8\times10^{-4}$ | $4\times10^{-4}$ |
| 1000 | ↓ | ↓ | $10^1$ | negligible | $10^{-4}$ | $5\times10^{-3}$ | $3\times10^{-3}$ |
| 1100 | ↓ | - | $3\times10^1$ | $10^{-11}$ | $5\times10^{-4}$ | $3\times10^{-2}$ | $2\times10^{-2}$ |
| 1200 | ↓ | ↓ | $8\times10^1$ | $6\times10^{-10}$ | $4\times10^{-3}$ | $10^{-1}$ | $7\times10^{-1}$ |
| 1300 | ↓ | ↓ | $2\times10^2$ | $10^{-8}$ | $3\times10^{-2}$ | $5\times10^{-1}$ | 2 |
| 1400 | ↓ | ↓ | $4\times10^2$ | $2\times10^{-7}$ | $2\times10^{-1}$ | 2 | 7 |

The actual vapor pressure $P_D$ of a dopant impurity material in a carrier droplet is expressed as follows:

$$P_D = (X_D/X_M)P_o$$

wherein
$P_D$ = actual vapor pressure
$P_o$ = equilibrium vapor pressure
$X_D$ = actual concentration of the dopant impurity material in the carrier droplet
$X_M$ = maximum equilibrium solubility of the dopant impurity material in the carrier droplet at the penetration temperature.

By employing this data we have been able to migrate dopant impurity materials which previously had been very hard, or impossible, to migrate thermally by temperature gradient zone melting. The evaluation of the data gathered from experiments of carrier droplets in silicon semiconductor material revealed devices of excellent commercial quality. It is to be noted however that where intermetallics are formed with silicon, the migration temperature must be greater than the temperature at which the intermetallic is formed. These temperatures are listed for the affected materials in Table II.

The combining of the teachings of this invention with the fine line technology teachings and off-axis temperature gradient zone melting enable one to fabricate line arrays wherein line widths are 2 mils or less and arrays of disc-like wherein the diameter of the disc may be as small as 2 mils.

In similar manner we have discovered that suitable carrier droplet materials for migration of a melt through germanium are lead, tin, gold, indium, silver, cadmium, thallium and zinc. The preferred carrier droplet materials are tin, gold, indium and alloys and combinations thereof since temperature gradient zone melting may be practiced at low temperatures to prevent unnecessary broadening of the P-N junction.Preferred junction. Preferred dopant impurity materials for use in the carrier droplets are aluminum and gallium for P-type doping and arsenic for N-type doping. These three materials are preferred since they can dope germanium sufficiently, even in a carrier droplet, to make the recrystallized germanium material degenerative as required for tunnel diodes and semiconductor neurons.

The two or more materials comprising the droplet may be deposited one upon the other or codeposited from individual sources or from one source containing a master alloy of the materials. The method of deposition depends on the materials employed, as individual's requirement and the relative stability of the materials involved. Further, the semiconductor materials through which the droplet is to be migrated thermally may also be included in the droplet to aid in wetting the surfaces of the body and to help the droplet penetrate the surface material for good initiation properties desirable for fine line and droplet migration. For a further teaching of the employment of semiconductor material in the melt to improve melt penetration at initiation of the thermal migration one is directed to copending application entitled "Enhanced Line Stability by Alloying of Deposition," Ser. No. 944,279, filed Sept. 21, 1978 assigned to the same assignee as this invention.

When employing gold as a carrier droplet element and one wants to retain long lifetime in the semiconductor material, one must practice thermal gradient zone melting at low temperatures where the solid solubility of gold is small.

Silver has some advantages over gold when employed as a carrier droplet. In particular, silver does not produce as many recombination centers as gold. Silver may also be used as a carrier droplet to dope silicon either N type or P type by using antimony or aluminum in the migrating melt. Silver is also less expensive than gold and is a consideration in making some products.

Silver also has some disadvantages. Silver does not migrate as rapidly as gold because its liquidus slope is steep. When a silicon wafer is heated by an infrared source, the migration rate of silver below 1200° C. is very slow being of the order of $\sim 10^{-6}$ cm/sec. Therefore, silver is a marginal carrier droplet element. Tin, lead, indium and gallium migrate at a slow rate at reasonable temperatures of practicing TGZM.

Therefore, a droplet of a gold-silver alloy is more economical to use. The lifetime characteristics imparted to silicon are better than gold. Thermal migration rates are greater than silver alone.

Silver and aluminum can be used in a droplet. The rate of thermal migration for the droplet is greater than for silver alone. Doping of silicon is P-type but the impurity concentration is less than for aluminum alone.

Silver and tin may be employed in a droplet. The rate of thermal migration for the droplet is greater than for tin alone. The lifetime of the recrystallized semiconductor material is longer than the original silicon material.

Ternary alloys may also be used in a carrier droplet combination. For instance silver-gold-antimony and silver-tin-antimony may be used to dope silicon N-type. Aluminum-indium-gallium may be used to dope silicon P-type. Silver-aluminum-antimony may be used to dope silicon either N or P type depending on the TGZM process temperature and droplet material composition by weight percent of each. Ag-10at%Al-2at%Sb at 1200° C. dopes silicon P-type. Ag-10at%Sb-10at%Al at 1200° C. dopes silicon N-type.

We claim as our invention:

1. In the method of moving a melt of metal-rich semiconductor material through a solid body of silicon semiconductor material by thermal gradient zone melting processing comprising the steps of
   a. selecting a body of single crystal semiconductor material so that the body has a first type conductivity, a selected resistivity, and at least one major surface having a preferred planar crystal structure orientation which is one selected from the group consisting of (100), (110) and (111), the vertical axis of the body being substantially aligned with a first axis of the crystal structure;
   b. preparing the surface having the preferred planar crystal structure orientation to accommodate one or more physical configurations of a layer of metal thereon;
   c. vapor depositing a layer of metal on the selected surface of the body of semiconductor material;
   d. heating the body and the metal deposit to a temperature sufficient to form a melt of metal-rich material on the surface of the body;
   e. establishing a unidirectional temperature gradient along substantially the vertical axis of the body and the first axis of the crystal structure;
   f. migrating the metal-rich melt through the body along the unidirectional temperature gradient to divide the body into a plurality of regions of first type conductivity and to form at least one array of regions of recrystallized material of the body having solid solubility of the vapor deposited metal therein, the metal including at least one dopant impurity material therein to impart a predetermined second type conductivity and a selected level of resistivity thereto;
   the improvement in the method of processing which includes
   vapor depositing a layer of metal which comprises
   a first material which includes at least a first metal which improves physical properties of the melt such as the penetration of the melt, when formed, into the surface of the body, increases stability of the migration of the melt through the body, and increases the rate of melt migration through the body, the at least one first metal is one selected from the group consisting of aluminum, gallium, indium and magnesium, and
   a second material which includes at least a second metal which imparts to the recrystallized region predetermined electrical characteristics of conductivity type, level of resistivity, and control of lifetime and the like, and
   the temperature gradient zone melting is practiced at a temperature greater than the temperature at which intermetallic compounds are formed by the material of the semiconductor body and the at least one first metal.

2. The method of claim 1 wherein
the second metal is one selected from the group consisting of aluminum and antimony.

3. The method of claim 1 wherein
the second metal is one selected from the group consisting of silver, gold, tin and platinum.

4. The method of claim 1 wherein
the first metal is magnesium, and
the second metal is one selected from the group consisting of gallium and indium.

5. The method of claim 1 wherein
the first material also includes a predetermined amount of the silicon material of the body to aid in wetting and penetration into the body by the carrier droplet when heated to the temperature to form the melt and to begin thermal migration.

6. The method of claim 1 wherein
the first metal is gallium, and
the second metal is one selected from the group consisting of phosphorus, indium and arsenic.

7. The method of claim 1 wherein
the at least one first metal is indium, and
the second metal is one selected from the group consisting of arsenic, and gallium.

8. The method of claim 1 wherein
the first metal is aluminum, and
the second metal is one selected from the group consisting of arsenic, gallium, indium and boron.

9. In the method of moving a melt of metal-rich semiconductor material through a solid body of germanium semiconductor material by thermal gradient zone melting processing comprising the steps of
   a. selecting a body of single crystal semiconductor material so that the body has a first type conductivity, a selected resistivity, and at least one major surface having a preferred planar crystal structure orientation which is one selected from the group consisting of (100), (110) and (111), the vertical axis of the body being substantially aligned with a first axis of the crystal structure;
   b. the surface having the preferred planar crystal structure orientation to accommodate one or more physical configurations of a layer of metal thereon;
   c. vapor depositing a layer of metal on the selected surface of the body of semiconductor material;
   d. heating the body and the metal deposit to a temperature sufficient to form a melt of metal-rich material on the surface of the body;
   e. establishing a unidirectional temperature gradient along substantially the vertical axis of the body and the first axis of the crystal structure;
   f. migrating the metal-rich melt through the body along the unidirectional temperature gradient to divide the body into a plurality of regions of first type conductivity and to form at least one array of regions of recrystallized material of the body having solid solubility of the vapor deposited metal therein, the metal including at least one dopant impurity material therein to impart a predetermined second type conductivity and a selected level of resistivity thereto;
   the improvement in the method of processing which includes
   vapor depositing a layer of metal which comprises
   a first material which includes at least a first metal which improves the penetration of the melt, when formed, into the surface of the body and increases stability of the migration of the melt through the body, and/or increases the rate of melt migration through the body, the first metal being one selected from the group consisting of indium, cadmium, thallium and zinc, and
   a second material which includes at least a second metal which imparts to the recrystallized region predetermined electrical characteristics of conductivity type, level of resistivity, and control of lifetime and the like, and the temperature gradient zone melting is practiced at a temperature greater than the temperature at which intermetallic compounds are formed by the material of the semiconductor body and the at least one first metal.

10. The method of claim 9 wherein the second metal is one selected from the group consisting of aluminum, gallium and arsenic.

* * * * *